United States Patent
Hashimoto

(10) Patent No.: US 6,391,667 B1
(45) Date of Patent: May 21, 2002

(54) POWER SUPPLY UNIT, SEMICONDUCTOR DEVICE TESTING APPARATUS AND SEMICONDUCTOR DEVICE TESTING METHOD

(75) Inventor: Yoshihiro Hashimoto, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 09/541,916

(22) Filed: Apr. 3, 2000

(30) Foreign Application Priority Data

Apr. 1, 1999 (JP) .......................................... 11-095514
Mar. 16, 2000 (JP) ....................................... 2000-073200

(51) Int. Cl.[7] .......................... H01L 21/66; H02M 1/14; H03K 17/16
(52) U.S. Cl. ........................ 438/17; 363/45; 327/379; 327/594
(58) Field of Search ....................... 438/14, 17; 363/39, 363/40, 44, 45; 327/100, 104, 124, 261, 362, 379, 389, 390, 530, 531, 532, 538, 540, 544, 549, 551, 552, 553, 554, 594

(56) References Cited

U.S. PATENT DOCUMENTS 6,198,645 B1 * 3/2001 Kotowski et al.

* cited by examiner

*Primary Examiner*—Charles Bowers
*Assistant Examiner*—Evan Pert
(74) *Attorney, Agent, or Firm*—Rosenthal & Osha L.L.P.

(57) ABSTRACT

A power supply unit which supplies voltage to electric components, includes: a DC power supply (40) which supplies DC voltage to the electric components; at least one capacitor (C1), provided between the DC power supply (40) and the electric components, which charges the DC voltage; an input switch (SW1*a*) which connects or disconnects the capacitor (C1) and the DC power supply (40); and an output switch (SW1*b*) which connects or disconnects the capacitor (C1) and the electric components (semiconductor device under test); and a switching control unit (60) which charges the capacitor (C1) and supplies the DC voltage charged in the capacitor (C1) to the electric components. Thereby, the DC voltage to be supplied to the electric components or semiconductor device under test can be temporarily switched to low-noise DC voltage supplied from the charged-up capacitor (C1) during the test.

20 Claims, 6 Drawing Sheets

POWER SUPPLY UNIT, SEMICONDUCTOR DEVICE TESTING APPARATUS AND SEMICONDUCTOR DEVICE TESTING METHOD

BACKGROUND OF THE INVENTION

1. Field of the Invention

The present invention relates to a semiconductor device testing apparatus and method, and in particular to a semiconductor device testing apparatus equipped with a power supply unit capable of outputting a low-noise DC voltage.

2. Description of the Related Art

FIG. 1 is a block diagram showing a conventional power supply unit 30. The power supply unit 30 includes an AC-DC power supply 40 and a capacitor C1. The AC-DC power supply 40 receives AC voltage from an AC power supply 220, and then converts it to DC voltages VDD and VSS (VDD>VSS) so as to supply the DC voltage to a semiconductor device 200 placed on a device contact portion 90 of a semiconductor device testing apparatus. The capacitor C1 is provided between the AC-DC power supply 40 and the semiconductor device 200, connects the VDD and VSS and charges or discharges the DC voltage supplied from the AC-DC power supply 40.

The capacitor C1 is small sized and of large capacity. By inserting the C1 between the VDD and VSS, the noise contained in the DC voltage supplied from the AC-DC power supply can be reduced.

In the conventional practice, a switching power supply, dropper power supply and so on are used as the AC-DC power supply 40. Advantageous aspects of the switching power supply lies in being small sized and having a desirable conversion efficiency while the advantageous aspect of the dropper power supply is that a voltage noise is small.

There are occasions where the low-noise voltage needs to be supplied to the semiconductor device 200 for certain types of semiconductors under test and certain testing procedures. For instance, when testing an analog circuit as the semiconductor device 200, especially, a high-speed analog circuit such as a video circuit and so on, the noise contained in the supplied voltage affects the test in a negative manner and eventually leads to inaccurate test results. Therefore, there are many occasions where the dropper power supply which outputs the low-noise voltage is used when testing the analog circuits or the like requiring the low-noise voltage supply.

However, since the unwanted power is radiated in the form of the heat in the dropper power supply, the conversion efficiency is very low. Besides, a radiator need be further provided. On the other hand, though the switching power supply is small sized and has a desirable conversion efficiency, a switching noise is caused because an oscillator provided in the power supply constantly oscillates. Hence, usage of the switching power supply is not desirable when a test requires the supply of low-noise voltage. Thus, it has been hoped to provide a small sized switching power supply having desirable conversion efficiency and capable of supplying the low-noise voltage.

SUMMARY OF THE INVENTION

Therefore, it is an object of the present invention to provide power supply unit, semiconductor device testing apparatus and semiconductor device testing method which overcome the above issues in the related art. This object is achieved by combinations described in the independent claims. The dependent claims define further advantageous and exemplary combinations of the present invention.

According to one aspect of the present invention, there is provided a power supply unit which supplies voltage to electric components, comprising: a DC power supply which supplies DC voltage to the electric components; a capacitor, provided between said DC power supply and the electric components, which charges the DC voltage; an input switch which connects or disconnects the capacitor and the DC power supply; and a switching control unit which charges the capacitor by switching the input switch ON, and supplies power charged in the capacitor to the electric components by switching the input switch OFF.

According to another aspect of the present invention, there is provided semiconductor device testing apparatus for testing a semiconductor device, comprising: a device contact portion which places the semiconductor device and inputs an input signal pattern to the semiconductor device; a DC power supply which supplies DC voltage to the semiconductor placed on the device contact portion; a capacitor which charges or discharges the DC voltage between the power supply and the semiconductor device; an input switch which connects or disconnects the capacitor and the DC power supply; a switching control unit which makes the capacitor charged with the DC voltage by switching the input switch ON, wherein switching control unit supplies the DC voltage charged in the capacitor by switching the input switch OFF, and wherein the switching control unit further includes a pattern generator which supplies the input signal pattern to the semiconductor device in the event that the switching control unit switches the input switch OFF and an output switch ON, where the output switch connects or disconnects the capacitor and the semiconductor device.

Moreover, the semiconductor device testing apparatus may further comprise an output switch which connects or disconnects the capacitor and the semiconductor device, wherein the switching control unit makes the capacitor charged with the DC voltage by switching the output switch OFF and switching the input switch ON, and wherein the switching control unit supplies the DC voltage charged in the capacitor to the semiconductor device by switching said output switch ON and switching the input switch OFF.

Moreover, the pattern generator may further comprise: an input signal pattern supplying unit which supplies the input signal pattern to the semiconductor device in the event that the switching control unit switches the output switch an the input switch ON, and wherein the switching control unit makes the input switch temporarily OFF in the event that the input signal pattern is being supplied to the semiconductor device.

Moreover, the semiconductor device testing apparatus may further comprise: a plurality of the capacitors, provided in parallel between said DC power supply and the semiconductor device, which charge the DC voltage; and a plurality of the output switches which connect or disconnect a plurality of the capacitors and the semiconductor device, and wherein the switching control unit, with one of said plural output switches being ON, makes other output switches OFF, while one of the plural output switches is being ON and the DC voltage charged in said capacitor is being supplied to the semiconductor device via the output switch having been ON.

Moreover, the semiconductor device testing apparatus may further comprise a plurality of the input switches which connect or disconnect the plural capacitors and the DC voltage respectively, wherein the switching control unit, with one of the plural input switches being ON, makes other input switches OFF while one of the plural input switches is ON and the DC voltage is charged from the DC power supply to the capacitor via the input switch having been ON.

It is preferable that the input switch, output switch and capacitor be provided removably so as to be replaced anew.

Preferably, the DC power supply is an AC-DC power supply which converts AC voltage supplied from an AC power supply, to DC voltage.

According to still another aspect of the present invention, there is provided a semiconductor device testing method of testing a semiconductor device using semiconductor device testing apparatus, the method comprising: charging DC voltage to a capacitor; and testing the semiconductor device by: disconnecting supply of the DC voltage to the capacitor; and inputting an input signal pattern to the semiconductor device while the DC voltage charged in the capacitor is being supplied to the semiconductor device.

Preferably, the charging includes charging the DC voltage to a first capacitor and a second capacitor, and the testing includes: disconnecting supply of the DC voltage to the first capacitor; and inputting the input signal pattern to the semiconductor device while the DC voltage charged in the first capacitor is being supplied to the semiconductor device. Moreover, the semiconductor device testing method may further comprise: stopping input of the input signal pattern to the semiconductor device; disconnecting supply of the DC voltage charged in the first capacitor to the semiconductor; replacing the semiconductor device with other semiconductor device; connecting the second capacitor to the replaced semiconductor device in order to supply the DC voltage charged in the second capacitor to the replaced semiconductor device.

Moreover, the semiconductor device testing method may further comprise: resuming charging the DC voltage to the first capacitor after said connecting; and resuming inputting the input signal pattern to the semiconductor device.

Moreover, in the semiconductor device testing method where there are provided a first input switch and a second input switch which connect or disconnect respectively supply of the DC voltage to the first capacitor and the second capacitor, and there are provided a first output switch and a second output switch which connect or disconnect respectively supply of the DC voltage charged in the first capacitor and the second capacitor to the semiconductor device, it is preferably that the disconnecting disconnects supply of the DC voltage charged in the first capacitor to the semiconductor device by switching the first output switch OFF, where the connecting supplies the DC voltage charged in the second capacitor to the semiconductor by switching the second output switch ON and by switching the second input switch OFF, and the resuming resumes charging of the first capacitor with the DC voltage by switching the first input switch ON.

Moreover, the semiconductor device testing method may further comprise: first measuring voltage of the first or second capacitor charged, prior to said testing; second measuring voltage of the first or second capacitor after said testing; first calculating an amount of current consumption of the semiconductor, based on difference between the voltage of the first or second capacitor measured in said first measuring and that measured in said second measuring; and second calculating an average amount of current consumption of the semiconductor, based on result obtained after repeating a plurality of times the first measuring, the second measuring and the first calculating.

Moreover, the semiconductor device testing method may further comprise: measuring voltage of either the first capacitor or the second capacitor; and replacing the first capacitor and the second capacitor anew in the event that voltage of the first capacitor and second capacitor measured in said measuring is less than a predetermined reference voltage.

This summary of the invention does not necessarily describe all necessary features so that the invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

First Embodiment

Figure 1:
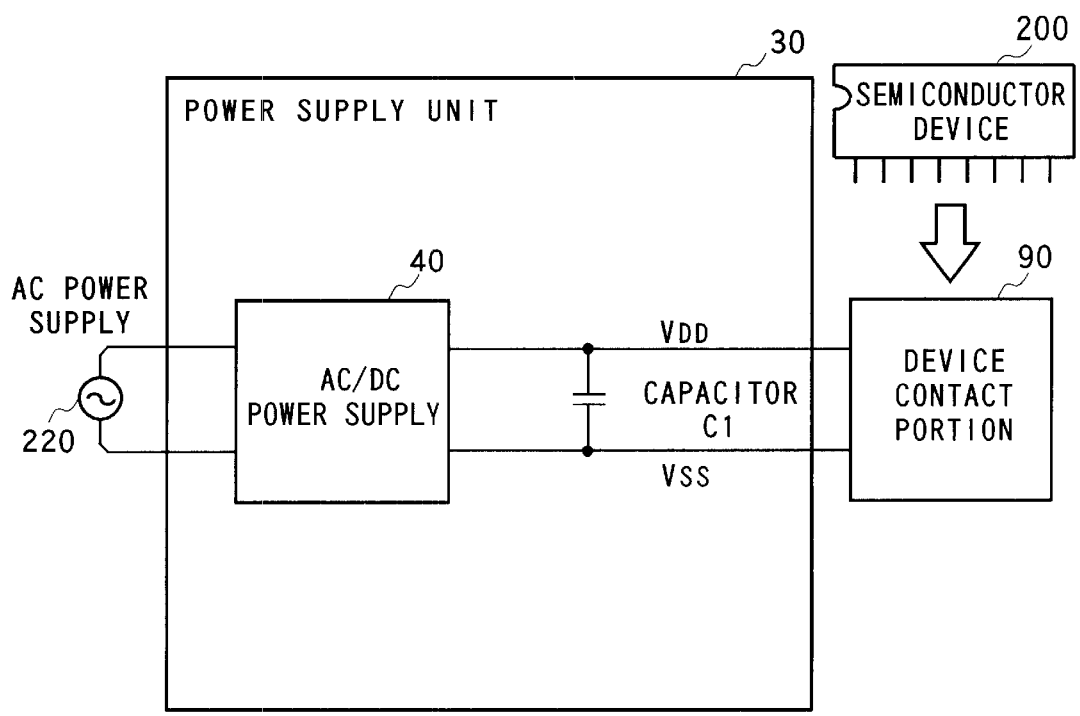
FIG. 1 is a block diagram showing a conventional power supply unit 30.
Figure 2:
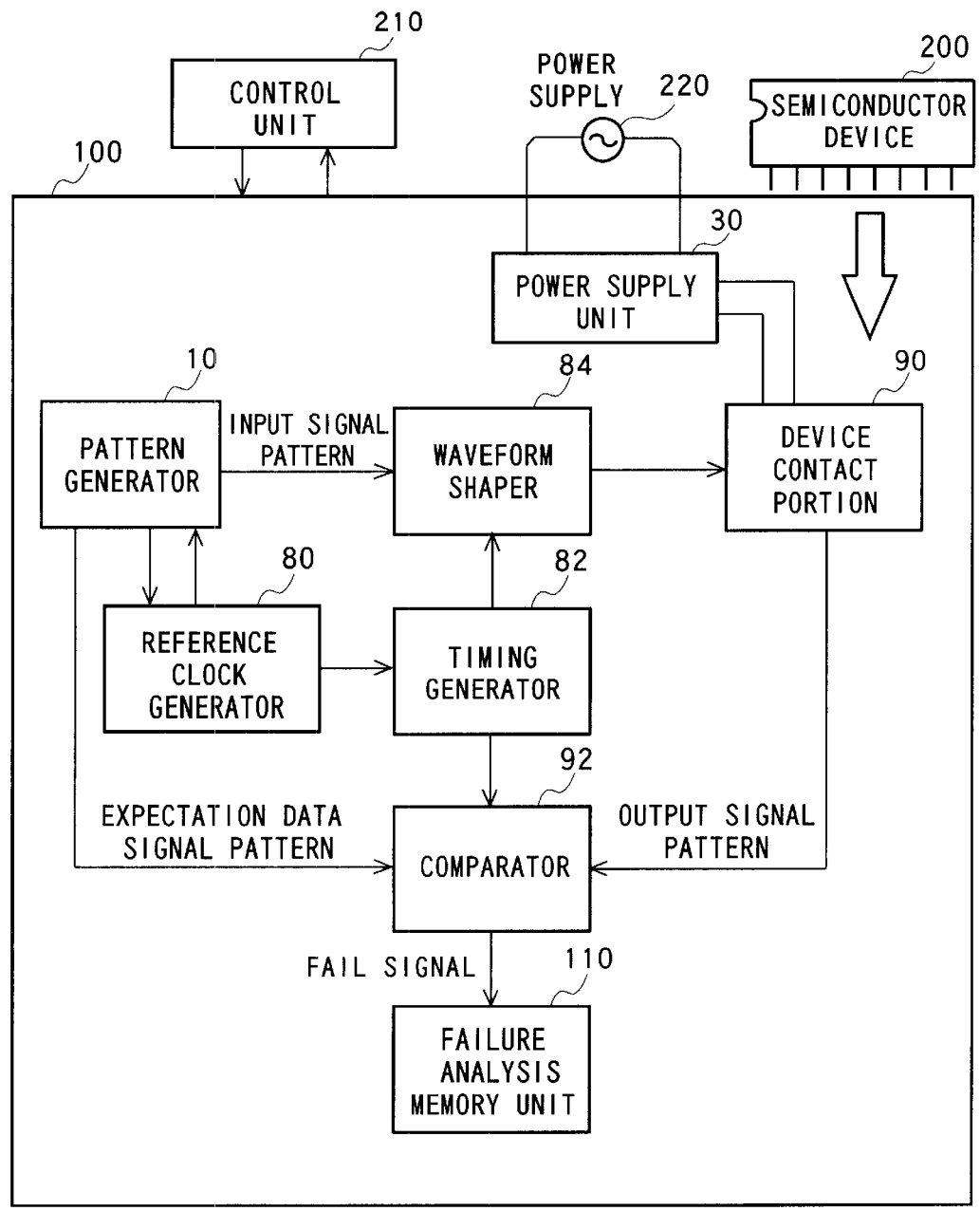
FIG. 2 is a block diagram showing an overall construction of a semiconductor device testing apparatus 100 according to the first embodiment.

FIG. 2 is a block diagram showing an overall construction of a semiconductor device testing apparatus 100 according to the first embodiment. The semiconductor device testing apparatus 100 comprises: a pattern generator 10; a reference clock generator 80; a timing generator 82; a waveform shaper 84; a power supply unit 30; a device contact portion 90; a comparator 92; and a failure analysis memory unit 110. The semiconductor device testing apparatus 100 is used for testing a semiconductor device 200 such as a memory device and a logic IC and so on.

The pattern generator 10 generates an input signal pattern to be input to the semiconductor device 200 under test, and generates an expectation data signal pattern, based on a predetermined control sequence, which is to be output from the semiconductor device 200 in the event that the input signal pattern is input. The reference clock generator 80 respectively outputs reference clocks to the pattern generator 10 and the timing generator 82. The timing generator 82 generates a timing signal at various timings, which controls a timing at which the input signal pattern is input to the semiconductor device 200, based on the reference clock.

The waveform shaper 84 shapes a waveform of the input signal pattern based on the timing signal, in order to comply with a characteristic of the semiconductor device 200, and controls the input of the input signal pattern to the semiconductor device 200 based on the timing signal. When the clock control signal is output from the pattern generator 10 to the reference clock generator 80, the output of the reference clock from the reference clock generator 80 to the timing generator 82 is stopped, and the output of the timing signal from the timing generator 82 is also stopped. The controlled waveform shaper 84 then stops the input of the input signal pattern to the semiconductor 200.

The semiconductor device 200 is placed on the device contact portion 90, and receives the input signal pattern shaped by the waveform shaper 84. Thereafter the shaped input signal pattern is input to input pins of the semiconductor device 200. The semiconductor device 200 under test may then be housed in a package or may be a wafer form.

Moreover, the device contact portion 90 maybe a socket that plugs in the semiconductor device 200 housed in the package, or may be a probe pin or a bump in direct contact with a terminal provided on the wafer. A pattern data portion designated as such within the input signal pattern is input to a data input pin of the semiconductor device 200; a control signal portion designated as such within the input signal pattern is input to a control pin of the semiconductor device 200; and an address signal portion designated as such within the input signal pattern is input to an address pin of the semiconductor device 200, respectively. The device contact portion 90 receives an output signal pattern from the semiconductor device 200, and outputs the output signal pattern to a comparator 92.

Upon receipt of an AC voltage from an AC power supply 220, the power supply unit 30 converts the AC voltage to a DC voltage in order to supply DC voltage to the semiconductor device 200 placed on the device contact portion 90. In the present embodiment, the power supply unit 30 is used for supplying the DC voltage to the semiconductor device 200 in the semiconductor testing apparatus 100. However, the usage of the power supply unit 30 is not limited, as the power supply unit 30 can also supply DC voltage to drive other electric components.

The comparator 92, including an exclusive OR logic circuit, receives the output signal pattern and the expectation signal pattern, and logic-compares them based on the timing signal output from the timing generator 82. The comparator 92 then outputs a fail signal to the failure analysis memory unit 110, in the event that the signal pattern does not match the expectation signal pattern (that is, if failure occurs).

The fail signal is stored in the failure analysis memory unit 110, so that a location of the defective portion in the semiconductor device 200 is determined and analyzed based on the stored fail signal. Moreover, each portion of the semiconductor device 200 is controlled by a control unit 210.

Figure 3:
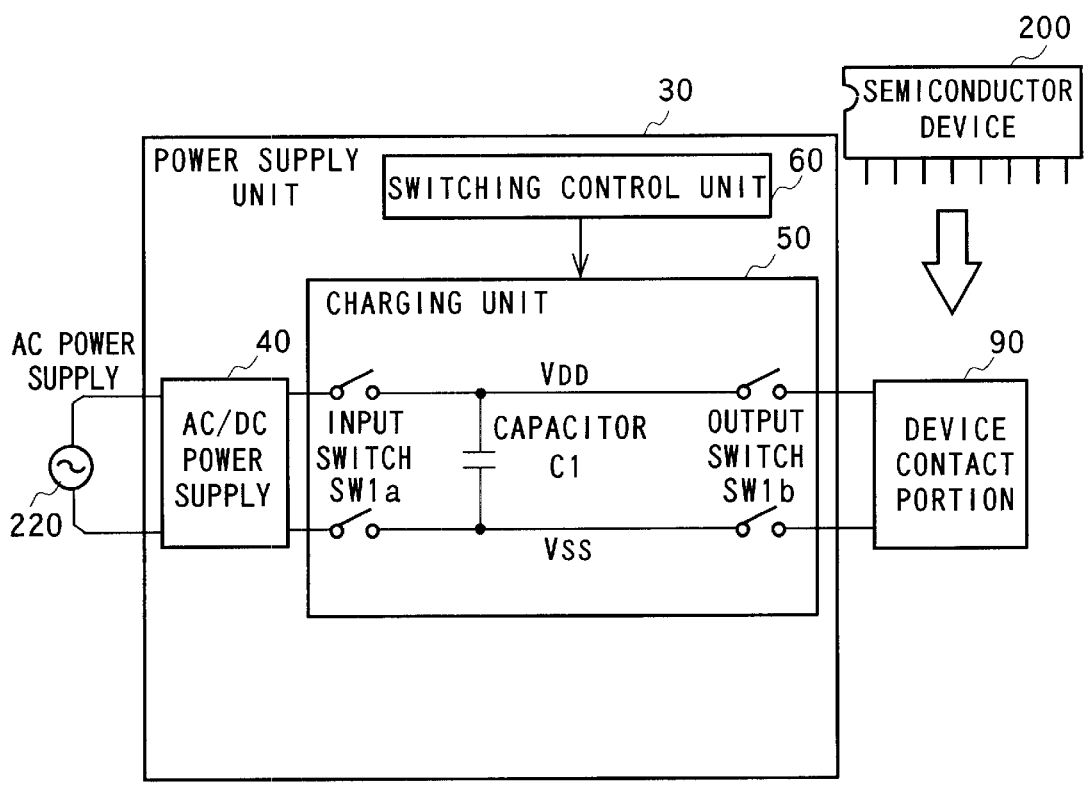
FIG. 3 is a block diagram showing the power supply unit 30 according to the present embodiment.

FIG. 3 is a block diagram showing the power supply unit 30 according to the present embodiment. The power supply unit 30 comprises an AC-DC power supply 40; a charging unit 50; and a switching control unit 60. In the present embodiment, a switching power supply is used as the AC-DC power supply 40.

The charging unit 50 includes a capacitor C1, an input switch SW1$a$ and an output switch SW1$b$. Upon receipt of the AC voltage from the AC power supply 220, the AC-DC power supply 40 converts it to DC voltages VDD and VSS (where VDD>VSS) so as to supply the DC voltages to the semiconductor device 200 placed on the device contact portion 90. The capacitor C1 provided between the AC-DC power supply 40 and the semiconductor device 200 placed on the device contact portion 90, connects VDD and VSS, and charges or discharges the DC voltage supplied from the AC-DC power supply 40.

The capacitor C1 is compact in size, with a large capacity. The capacitor C1 reduces noise contained in the DC voltage supplied from the AC-DC power supply 40, by connecting to VDD and VSS. Suppose that the capacity C=5000 F, an allowable voltage drop at power supply terminals $\Delta V=0.0001$ V, and a supply current I=1A with a supply time of t, then the voltage drop at the power supply terminals is $\Delta V=(I*t)/C$. Thus, $t=(\Delta V*C)/I=(0.01V*5000F)/1A=50$ s. Namely, the DC voltage can be supplied from the capacitor C1 to the semiconductor device 200 for approximately 50 seconds.

The input switch SW1$a$ connects or disconnects the AC-DC power supply 40 and the capacitor C1. In the present embodiment, both the VDD side and the VSS side of the capacitor C1 are connected to or disconnected from the AC-DC power supply 40 via the input switch SW1$a$.

The output switch SW1$b$ connects or disconnects the semiconductor device 200 and the capacitor C1. In the present embodiment, both the VDD side and the VSS side of the capacitor C1 are connected to and disconnected from the semiconductor device 200 via the output switch SW1$b$.

In the present embodiment, the output switch SW1$b$ is provided such that SW1$b$ connects or disconnects between the semiconductor device 200 and the capacitor C1 in the power supply unit 30. Moreover, the output switch SW1$b$ may be provided in the device contact portion 90. Namely, it suffices to have a configuration such that the supply of the DC voltage to the semiconductor device 200 can be disconnected in the event of replacing the semiconductor device under test.

The switching control unit 60 controls the ON's and OFF's of both the input switch SW1$a$ and the output switch SW1$b$ included in the charging unit 50. In order to avoid the occurrence of a "spike" accompanied by ON's and OFF's of switches, the input switch SW1$a$ and the output switch SW1$b$ may be configured such that the ON's and OFF's are performed in rather a slow manner by gradually varying resistor values.

With both the output switch SW1$b$ and the input switch SW1$a$ being turned ON, both the capacitor and the semiconductor device 200 are connected the AC-DC power supply 40, and then the DC voltage is supplied from the AC-DC power supply 40 to both the capacitor C1 and the semiconductor device 200. In this case, the DC voltage supplied from the AC-DC power supply 40 is so supplied to the semiconductor device 200 that the noise of the DC voltage is reduced by the capacitor C1.

With the output switch SW1$b$ being OFF and the input switch SW1$a$ being ON, the capacitor C1 is disconnected from the semiconductor device 200, and then the AC-DC power supply 40 is connected to the capacitor C1. Thereby, the DC voltage is supplied from the AC-DC power supply 40 to the capacitor C1 so as to be charged by the capacitor C1.

With the output switch SW1$b$ being ON and the input switch SW1$a$ being OFF, the capacitor C1 is disconnected from the AC-DC power supply 40 while the capacitor C1 is connected to the semiconductor device 200, so that the DC voltage charged in the capacitor C1 is supplied to the semiconductor device 200. The DC voltage supplied from the charged-up capacitor C1 to the semiconductor device 200 contains further less noise compared to that supplied from the AC-DC power supply 40 to the semiconductor 200. For example, when testing an analog circuit as the semiconductor device under test including high-speed analog circuits such as a video circuit in particular, the noise contained in the voltage supplied has an unwanted affect on the test and test can not be carried out in a precise manner. Thus, in the event of testing the semiconductor devices 200 such as analog circuits, it is preferable that the DC voltage charged in the capacitor C1 be supplied.

After the voltage of the capacitor C1 in the state of having been charged is measured and the DC voltage charged in the capacitor C1 is supplied to the semiconductor device 200, the voltage of the capacitor C1 is measured again. A current consuming amount is calculated from a voltage difference after and prior to the supply. The current consuming amount is repeatedly measured for each type of test held, so that an average current consumption can be calculated.

The capacitor C1 will be gradually deteriorated as it repeats charging and discharging. In order that a worn-out capacitor C1 which is no longer suitable for use with the test can be replaced anew by removing it from the power supply unit 30, the charging unit is provided in a replaceable manner. Moreover, it may be configured that the capacitor C1, input switch SW1a and output switch SW1b be replaced separately and individually. As for judgment on whether or not the capacitor C1 is suitable for use with the test, the voltage of the charged-up capacitor C1 is measured, and it is determined based on whether or not the measured value is greater or less than a reference voltage. The reference voltage is an amount which is required to be supplied from the capacitor C1 to the semiconductor device 200 in the semiconductor device test, and is determined based on a test time during which the voltage need be supplied continuously to the semiconductor device 200.

Second Embodiment

The second embodiment differs from the first embodiment in the structure of the power supply unit 30.

Figure 4:
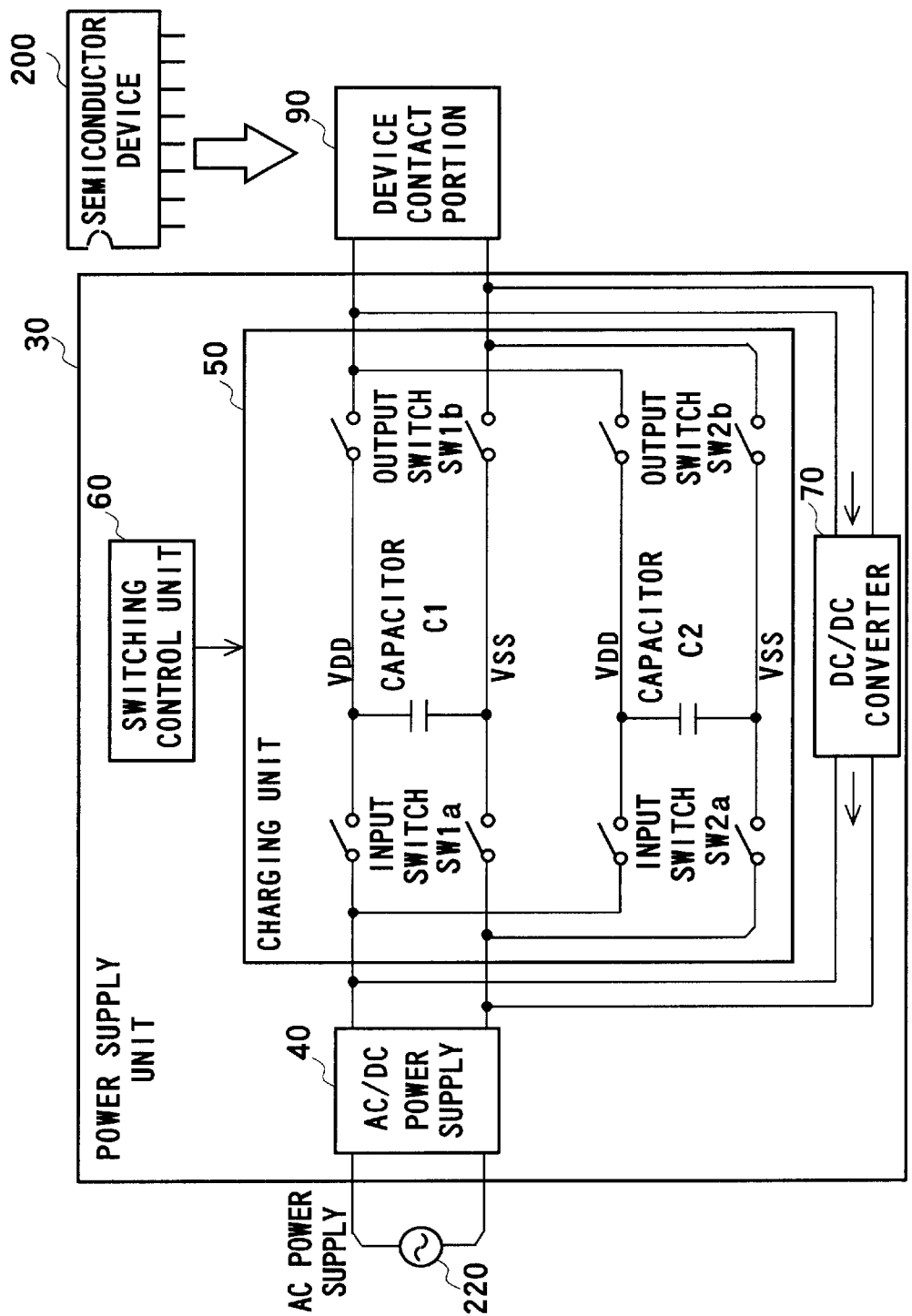
FIG. 4 is a block diagram showing a power supply unit 30 according to the second embodiment.

FIG. 4 is a block diagram showing a power supply unit 30 according to the second embodiment. The power supply unit 30 includes an AC-DC power supply 40, a charging unit 50, a switching control unit 60 and a DC-DC converter 70. In the present embodiment, there is utilized a switching power supply as the AC-DC power supply 40.

The charging unit 50 includes capacitors C1 and C2, input switches SW1a and SW2a, and output switches SW1b and SW2b. Upon receipt of the AC voltage from the AC power supply 220, the AC-DC power supply 40 converts the AC voltage to the DC voltage so as to supply the converted DC voltage to the semiconductor device 200 placed on the device contact portion 90. The capacitors C1 and C2 are provided between the AC-DC power supply 40 and the semiconductor device 200 placed on the device contact portion 90 so as to connect VDD and VSS in parallel. Thereby, the DC voltage is charged in and discharged from the capacitor C1 and C2.

The capacitors C1 and C2 are compact-sized and of large capacity. By connecting VDD to VSS, noise contained in the DC voltage supplied from the AC-DC power supply 40 can be reduced. Similar to the capacitor C1 shown in FIG. 3, the capacitors C1 and C2 are capable of continuously supplying voltage to the semiconductor device 200 for approximately 50 seconds.

The input switch SW1a connects or disconnects between the AC-DC power supply 40 and the capacitor C1. The input switch SW2a connects or disconnects between the AC-DC power supply 40 and the capacitor C2. In the present embodiment, both the VDD side and the VSS side of the capacitor C1 are connected to or disconnected from the AC-DC power supply 40 by the input switch SW1a. Both the VDD side and the VSS side of the capacitor C2 are connected to or disconnected from the AC-DC power supply 40 by the input switch SW2a.

The output switch SW1b connects or disconnects between the semiconductor device 200 and the capacitor C1. The output switch SW2b connects or disconnects between the semiconductor device 200 and the capacitor C2. In the present embodiment, both the VDD side and the VSS side of the capacitor C1 are connected to or disconnected from the semiconductor device 200 by the output switch SW1b. Both the VDD side and the VSS side of the capacitor C2 are connected to or disconnected from the semiconductor device 200 by the output switch SW2b.

The switching control unit 60 controls an ON-OFF switching of the input switches SW1a and SW2a and the output switches SW1b and SW2b included in the charging unit 50. In order to avoid occurrence of "spike" accompanied by ON's and OFF's of switches, the input switches SW1a and SW2a and the output switches SW1b and SW2b may be configured such that the ON's and OFF's are performed in rather a slow manner by gradually varying resistor values.

Though in the present embodiment there are provided two each or the input switch and the output switch, there may be provided three or greater each for the input switch and the output switch. With both the output switch SW1b and the input switch SW1a being turned ON, both the capacitor C1 and the semiconductor device 200 are connected to the AC-DC power supply 40. Then, the DC voltage is supplied from the AC-DC power supply 40 to both the capacitor and the semiconductor device 200. With both the output switch SW2b and the input switch SW2a being turned ON, both the capacitor C2 and the semiconductor device 200 are connected to the AC-DC power supply 40. Then, the DC voltage is supplied from the AC-DC power supply 40 to both the capacitor C2 and the semiconductor device 200. The DC voltage supplied from the AC-DC power supply 40 is so supplied to the semiconductor device 200 that the noise of the DC voltage is reduced by the capacitor C1 or the capacitor C2.

With the output switch SW1b being OFF and the input switch SW1a being ON, the capacitor C1 is disconnected from the semiconductor device 200, and then the AC-DC power supply 40 is connected to the capacitor C1. Thereby, the DC voltage is supplied from the AC-DC power supply 40 to the capacitor C1 so as to be charged by the capacitor C1. With the output switch SW2b being OFF and the input switch SW2a being ON, the capacitor C2 is disconnected from the semiconductor device 200, and then the AC-DC power supply 40 is connected to the capacitor C2. Thereby, the DC voltage is supplied from the AC-DC power supply 40 to the capacitor C2 so as to be charged by the capacitor C2.

With the output switch SW1b being ON and the input switch SW1a being OFF, the capacitor C1 is disconnected from the AC-DC power supply 40 while the capacitor C1 is connected to the semiconductor device 200, so that the DC voltage charged in the capacitor C1 is supplied to the semiconductor device 200. With the output switch SW2b being ON and the input switch SW2a being OFF, the capacitor C2 is disconnected from the AC-DC power supply 40 while the capacitor C2 is connected to the semiconductor device 200, so that the DC voltage charged in the capacitor C2 is supplied to the semiconductor device 200.

The DC voltage supplied from the charged-up capacitor C1 or capacitor C2 to the semiconductor device 200 contains further less noise compared to that supplied from the AC-DC power supply 40 to the semiconductor 200. Thus, in the event of testing the semiconductor devices 200 such as analog circuits, it is preferable that the DC voltage charged in the capacitor C1 or capacitor C2 be supplied.

While the DC voltage charged up in the capacitor C1 is being supplied to the semiconductor device 200, the capacitor C2 is being charged. After a predetermined period of time elapses, the DC voltage charged up in the capacitor C2 is supplied to the semiconductor device 200 and the capacitor C2 will now be charged during which the DC voltage is being supplied from the capacitor C2. In this manner, the capacitor C1 and capacitor C2 alternately voltage-supply or voltage-charge so that the DC voltage can be continuously supplied to the semiconductor device 200.

In case where there are provided, respectively, a plurality of (greater than or equal to three) capacitors, input switches and output switches, the switching control unit 60 controls the respective output switches so that the DC voltage charged in one of the capacitors can be supplied to the semiconductor device 200. While the one of the capacitors is supplying the DC voltage to the semiconductor device 200, the switching control unit 60 controls respective input switches so that other capacitors can be charged.

After the voltage of the capacitor C1 or C2 in the state of having been charged is measured and the DC voltage charged in the capacitor C1 or C2 is supplied to the semiconductor device 200, the voltage of the capacitor C1 or C2 is measured again. A current consumption can be calculated from a voltage difference after and prior to the voltage supply. The current consumption is repeatedly measured for each type of test held, so that an average current consumption can be calculated.

The capacitor C1 will gradually deteriorate as it repeats charging and discharging. In order that such a worn-out capacitor C1 which is no longer suitable for use with the test can be replaced anew by removing it from the power supply unit 30, the charging unit is provided in a replaceable manner. Moreover, it may be configured that a set of the capacitor C1, input switch SW1a and output switch SW1b be replaced as one set while a set of the capacitor C2, input switch SW2a and output switch SW2b as another set, respectively. Moreover, it may be configured that the capacitors C1 and C2, input switches SW1a and SW2a and output switches SW1b and SW2b be replaced separately and individually. As for judgment on whether or not the capacitors C1 and C2 is suitable for use with the test, the voltage of the charged-up capacitors C1 and C2 is measured, and it is determined, in a similar manner to the capacitor C1 shown in FIG. 3, based on whether or not the measured value is greater or less than a reference voltage.

DC-DC converter 70 removes the charge which remains in a capacitor provided in the close vicinity of the test-performed semiconductor device 200 before the semiconductor device having completed the test is replaced with other semiconductor device 200.

Figure 5:
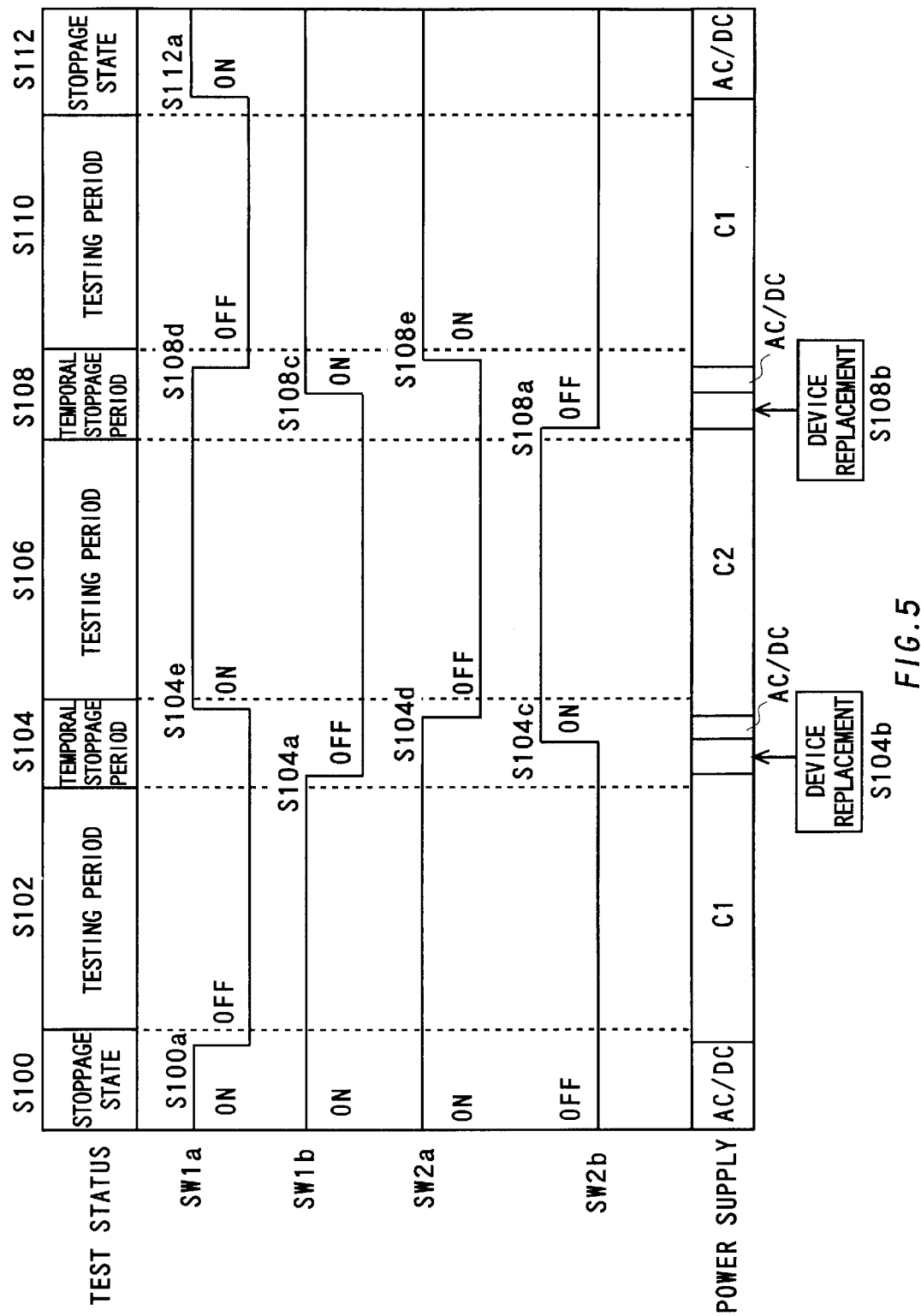
FIG. 5 is a timing chart showing operations of the charging unit 50 in a semiconductor device test.

FIG. 5 is a timing chart showing operations of the charging unit 50 in a semiconductor device test. In a test stoppage state S100 prior to the start of the test, the input switch SW1a, output switch SW1b and input switch SW2a are turned ON, and the output switch SW2b is turned OFF. In this state, the DC voltage is supplied from the AC-DC power supply 40 to the semiconductor device 200 while the DC voltage supplied from the AC-DC power supply 40 is charged in the capacitors C1 and C2. Next, prior to entering the first test period (S102), the input switch SW1a is turned OFF, so that the capacitor C1 is disconnected from the AC-DC power supply 40 and the DC voltage charged in the capacitor C1 is supplied to the semiconductor device 200 (S100a).

In order to avoid the occurrence of "spike" accompanied by ON's and OFF's of the input switches SW1a and SW2a and the output switches SW1b, those switches may be configured such that the ON'S and OFF's are performed in rather a slow manner by gradually varying resistor values. However, since respective switchings are not performed during the testing periods (S102, S106, S110) in the present embodiment, the occurrence of "spike" does not affect each testing.

In the first testing period (S102), the pattern generator 10 supplies the input signal pattern to the device contact portion 90 while the DC voltage charged in the capacitor C1 is being supplied to the semiconductor device 200. Thereby, the input signal pattern is input to the semiconductor device 200, and the semiconductor device 200 is tested. The duration required for the first test (S102) is approximately several seconds to several tens of seconds. Thus, since the capacitor C1 can supply the DC voltage for approximately 50 seconds, C1 suffices to serve as a power supply.

When the first test (S102) ends, the input of the input signal pattern to the semiconductor device 200 is stopped so that the semiconductor device 200 having completed the test can be replaced with other semiconductor device 200 and so on. Thereby, the test is stopped temporarily (S104). The temporal stoppage period accounts for a few seconds. During this temporal stoppage period, the output switch SW1b is turned OFF, and then the supply of the DC voltage charged in the capacitor C1 to the semiconductor device 200 is disconnected (S104a). After the disconnection, processes among which the semiconductor device 200 having completed the test is replaced with other semiconductor device 200 are carried out (S104b).

Thereafter, the DC voltage from the AC-DC power supply 40 is supplied to the semiconductor device 200 by turning the output switch SW2b ON (S104c). Then, the DC voltage charged in the capacitor C2 is supplied to the semiconductor device 200 by turning the input switch SW2a OFF (S104d). Thereafter, the input switch SW1a is turned ON (S104e), then the DC voltage is re-charged in the capacitor C1 from the AC-DC power supply 40.

In the present embodiment, the output switch SW1b is turned OFF in advance in order to prevent a short circuit of the capacitor C1 and the capacitor C2 prior to turning the output switch SW2b ON. This is because enough voltage cannot be supplied to a semiconductor device 200 to be used for the next test if the electric charge is transferred from the charged-up capacitor to the discharged capacitor. Similarly, prior to turning the output switch SW1b ON, the output switch SW2b is turned OFF in advance.

Similar to the output switches SW1b and SW2b, prior to turning the input switch SW1a ON, the input switch SW2a is turned OFF in advance in order to prevent a short circuit of the capacitor C1 and the capacitor C2. Similarly, prior to turning the input switch SW2a ON, the input switch SW1a is turned OFF in advance.

Though in the present embodiment the input switch SW2a is turned OFF after first turning the output switch SW2b ON, the output switch SW2b may be turned ON after first turning the input switch SW2a OFF. In that case, the voltage charged in the capacitor C2 drops when the output switch SW2b is turned ON.

Though in the present embodiment the input switch SW1a is turned ON (S104e) prior to the start of the second test (S106), the input switch SW1a may be turned ON after the start of the second test (S106). In that case, it suffices to secure enough time for the capacitor C1 to re-charge.

In the second testing period (S106), the pattern generator 10 supplies the input signal pattern to the device contact portion 90 while the DC voltage charged in the capacitor C2 is being supplied to the semiconductor device 200. Thereby, the input signal pattern is input to the semiconductor device 200, and the semiconductor device 200 is tested. Similar to the first test, the duration required for the second test (S106) is approximately several seconds to several tens of seconds. Thus, since the capacitor C2 can supply the DC voltage for approximately 50 seconds, C2 suffices to serves as a power supply.

When the second test (S106) ends, the test is temporarily stopped (S108)so that the semiconductor device 200 having completed the test can be replaced with other semiconductor device 200. Similar to the test stoppage period of the first test (S104), in this temporal stoppage period the output switch SW2b is turned OFF (S108a), so that the semiconductor device 200 having completed the test is replaced with other semiconductor device 200 (S108b). Thereafter, the output switch SW1b is turned ON (108c), the input switch SW1a is turned OFF (S108d), and the input switch SW2a is turned ON (S108e). Thereby, the DC voltage charged in the capacitor C1 is supplied to the semiconductor device 200. Then, the DC voltage is supplied from the AC-DC power supply 40 to the capacitor C2 so as to be charged.

When the next third test (S110) has completed, the test is n a stoppage state (S112). Then, the input switch SW1a is turned ON,(S112a), so that the DC voltage is supplied from the AC-DC power supply 40 to the capacitor C2 so as to be charged.

In the present embodiment, there are two temporal stoppage periods between the first test (S102) and the third test (S110). In case where the semiconductor device 200 under test is replaced in these stoppage periods, there will be no need of supplying the voltage to the semiconductor device 200. Thus, the power supply is switched over to other power supply during the temporal stoppage period, and the voltage can be continuously supplied by switching among a plurality of power supplies though the power supply can only supply the voltage for a short period of time.

Figure 6:
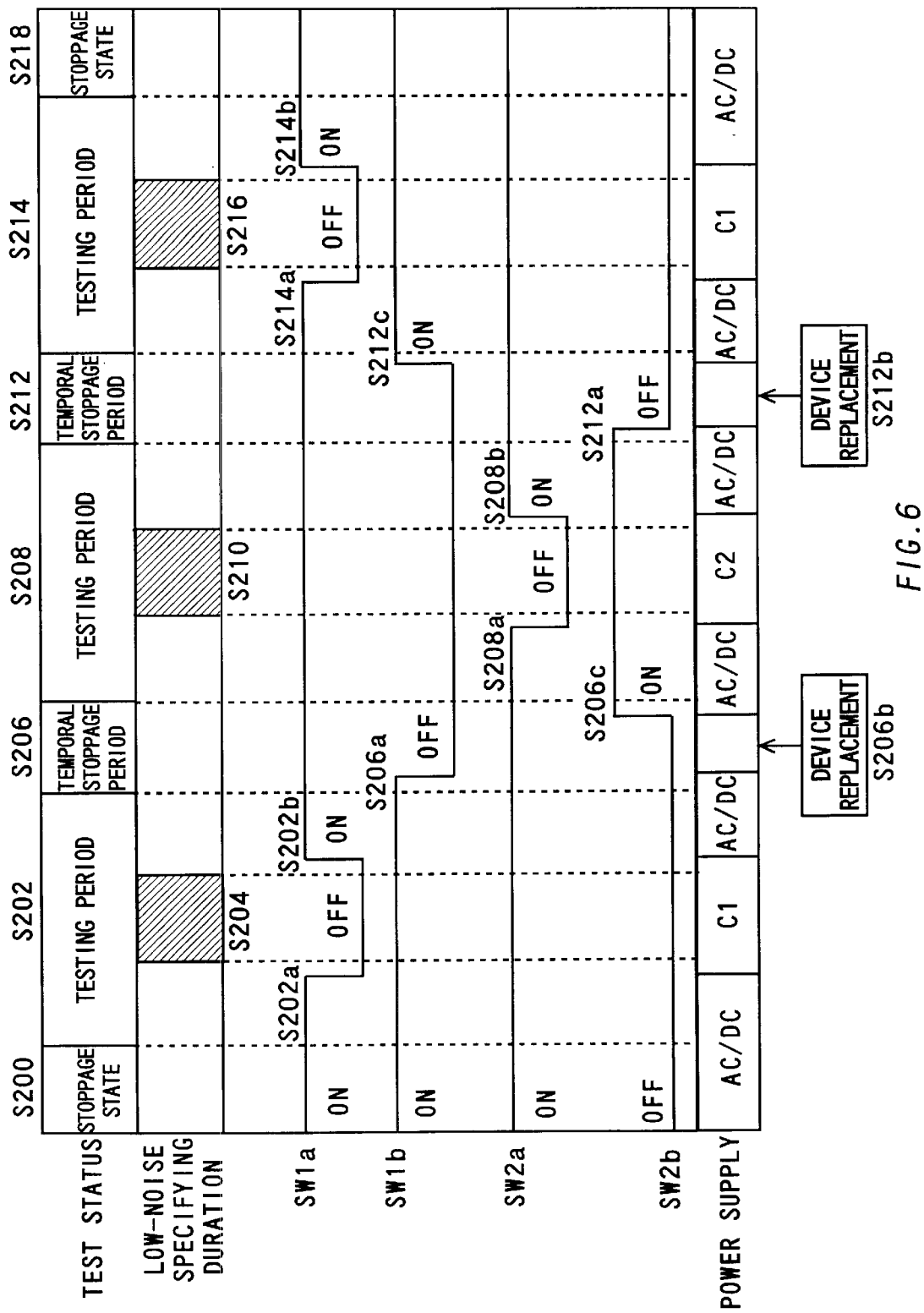
FIG. 6 is a timing chart showing operations of the charging unit 50 in a semiconductor device test including a low-noise specifying period in the test period.

FIG. 6 is a timing chart showing operations of the charging unit 50 in a semiconductor device test including a low-noise specifying period in the test period. Under normal usage, the DC voltage is supplied from the AC-DC power supply 40 to the semiconductor 200 in the present embodiment. In only performing a test particularly requiring to supply a low-noise voltage, the DC voltage charged in the capacitor C1 or C2 is supplied to the semiconductor device 200. Judgment on whether or not the low-noise voltage shall be supplied depends on a testing object or a type of the test in question. For example, when testing a logic IC, it suffices to supply the low-noise voltage for a test performed on portions related to an analog circuit such as a video circuit and so on. When testing portions related to other than the analog circuit, it suffices to supply the voltage from the AC-DC power supply 40. Among the first test (S202), second test (S208) and third test (S214), ones requiring the supply of such the low-noise voltage are periods corresponding to S204, S210 and S216 (low-noise specifying periods) respectively.

In the test stoppage state (S200) prior to the start of test, the input switch SW1a, output switch SW1b and input switch SW2a are turned ON, and the output switch SW2b is turned OFF. Under this state, while the DC voltage is supplied from the AC-DC power supply 40 to the semiconductor device 200, the DC voltage supplied from the AC-DC power supply 40 is charged in the capacitors C1 and C2.

In the first testing period (S202), the pattern generator 10 supplies the input signal pattern to the device contact portion 90 while the DC voltage is being supplied from the AC-DC power supply 40 to the semiconductor device 200. Thereby, the input signal pattern is input to the semiconductor device 200, and the semiconductor device 200 is tested. During the low-noise specifying period (S204), it is necessary to supply the DC voltage charged in the capacitor C1 to the semiconductor device 200 instead of supplying the DC voltage from the AC-DC power supply 40 to the semiconductor device 200. Thus, at least prior to entering the low-noise specifying period, the input switch SW1a shall be turned OFF (S202a), so that the supply of the DC voltage from the AC-DC power supply 40 to the semiconductor device 200 is shut off. Thereby, the low-noise voltage is supplied from the capacitor C1 to the semiconductor device 200.

In the low-noise specifying period (S204), the pattern generator 10 supplies the input signal pattern to the device contact portion 90 while the low-noise voltage is being supplied from the capacitor C1 to the semiconductor device 200. Thereby, the input signal pattern is input to the semiconductor device 200, and the semiconductor device 200 is tested. The duration required for the low-noise specifying period (S204) performing the analog test is at least shorter than that in the first testing period and is within several seconds to several tens of seconds. Thus, since the capacitor C1 can supply the DC voltage for approximately 50 seconds, C1 suffices to serve as a power supply.

After the low-noise specifying period (S204) elapses after completing the analog test, the DC voltage is supplied from the AC-DC power supply 40 to the capacitor C1 to the semiconductor device 200 (S202b) by switching again the input switch SW1a ON. Since the DC voltage is also supplied to the capacitor C1 from the AC-DC power supply 40, C1 charges as much as what was voltage-dropped during the low-noise specifying period (S204).

When the input switch SW1a is turned ON after the low-noise specifying period (S204), the capacitor C1 and the capacitor C2 are short-circuited for the input switch SW2a is then ON. However, shorter the low-noise specifying period (S204) elapses, the smaller the voltage drop of the capacitor C1 becomes, thus also the less the "spike" occurs. Therefore, the effect of the "spike" on the test is considered small. However, in order to further reduce the "spike", it is preferable that the input switch SW1a be turned ON in a slower manner by gradually varying the resistor values.

When the first test (S202) ends, the input of the input signal pattern to the semiconductor device 200 is stopped so that the semiconductor device 200 having completed the test can be replaced with other semiconductor device 200. Thereby, the test is temporarily stopped (S206). During this temporal stoppage, the output switch SW1b is turned OFF (S206a), and the supply of the DC voltage from the AC-DC power supply 40 to the semiconductor device 200 is disconnected. During the disconnection, the semiconductor device 200 is replaced with other semiconductor device 200 (S206b). After the replacement, the output switch SW2b is turned ON (S206c) at least prior to the start of the second test (S208) and then the DC voltage is again supplied from the AC-DC power supply 40 to the semiconductor device 200.

Similar to the first test (S202), in the second test (S208) it suffices to supply the low-noise voltage to the semiconductor device 200 only during the low-noise specifying period (S210). During other period than the low-noise specifying period, the DC voltage is supplied from the AC-DC power supply 40 to the semiconductor device 200. At least prior to entering the low-noise specifying period (S210), the input switch SW2a is turned OFF (S208a).

Thereby, the supply of the DC voltage from AC-DC power supply 40 to the semiconductor device 200 is disconnected, and the low-noise voltage is supplied from the capacitor C2 to the semiconductor device 200. During the low-noise specifying period, the analog test is performed. After the low-noise specifying period (S210) elapsed, the input switch SW2a is again turned ON (S208b) so that the DC voltage is supplied from the AC-DC power supply 40 to the semiconductor device 200.

Next, during the temporal test stoppage period (S212), similar to S206, the output switch SW2b is turned OFF (S212a) and the semiconductor device 200 is replaced with other semiconductor device 200 (S212b). At least prior to the start of the third test (S214), the output switch SW1b is turned ON (S212c). Similar to the first test (202) and second test (S208), in the third test (S214) the input switch SW1a is turned OFF prior to the low-noise specifying period (S214a) in order that the low-noise voltage can be supplied from the capacitor C1 to the semiconductor device 200 only during the low-noise testing period (S216). After the low-noise specifying period elapsed, the input switch SW1a is turned ON (S214b). The third test (S214) is now completed and the test enters the stoppage state (S218).

In the present embodiment, the supply of the DC voltage from the AC-DC power supply 40 to the semiconductor device 200 is disconnected by switching the input switches SW1a and SW2a. Thereby, the low-noise DC voltage charged in the capacitor C1 or C2 can be supplied to the semiconductor device 200 only during the low-noise specifying period.

As has been described, in the present embodiments, the AC-DC power supply 40 and the capacitor C1 are disconnected by the input switch SW1a, and the capacitor C1 is connected to the semiconductor device 200 by the output switch SW1b. Thereby, the low-noise DC voltage charged in the capacitor C1 can be supplied to the semiconductor device 200. Moreover, the AC-DC power supply 40 and the capacitor C2 are disconnected by the input switch SW2a, and the capacitor C2 is connected to the semiconductor device 200 by the output switch SW2b. Thereby, the low-noise DC voltage charged in the capacitor C2 can be supplied to the semiconductor device 200.

Moreover, in the present embodiments, the voltage is supplied from one of the capacitors C1 and C2 to the semiconductor device 200 and other capacitor will be charged by switching the input switches SW1a and SWw2a and the output switches SW1b and SW2b. Since the voltage supply and the charging are alternately repeated by the capacitors C1 and C2, so that the low-noise DC voltage can be continuously supplied from one among the capacitor C1 and capacitor C2 to the semiconductor device 200.

Moreover, according to the present embodiments, the connection between the AC-DC power supply 40 and the semiconductor device 200 can be temporarily disconnected by switching the input switch SW1a or the input switch SW2a. Thus, the DC voltage to be supplied to the semiconductor device 200 can be temporarily switched to the low-noise DC voltage during the test.

Moreover, according to the present embodiments, by comparing the measured voltage of the capacitor C1 or capacitor C2 prior to and after the voltage supply, the average current consumption by the semiconductor device 200 can be calculated.

Moreover, according to the present embodiments, when it is judged that the capacitor C1 or capacitor C2 is no longer suitable for further usage after the voltage of the charged capacitor C1 and capacitor C2 is measured, the thus judged capacitor can be replaced with other capacitor in due course.

Accordingly, the power supply unit comprises a single or plurality of capacitor(s), input switch (es) and output switch (es), so that the low-noise DC voltage can be supplied to the semiconductor device by switching the input switch(es) and the output switch(es).

Although the present invention has been described by way of exemplary embodiments, it should be understood that many changes and substitutions may be made by those skilled in the art without departing from the spirit and the scope of the present invention which is defined only by the appended claims.

What is claimed is:

1. A power supply unit for intermittently supplying a low-noise DC voltage to electric components, comprising:
   a DC power supply which supplies a DC voltage to the electric components;
   a capacitor, provided between said DC power supply and the electric components, wherein said DC power supply charges the capacitor to said DC voltage;
   an input switch which connects or disconnects said capacitor from said DC power supply; and
   a switching control unit which causes the capacitor to charge by switching said input switch ON, and causes said capacitor to supply a low-noise voltage by supplying said DC voltage of said charged capacitor to the electric components by switching said input switch OFF.

2. A power supply unit of claim 1, further comprising an output switch which connects or disconnects said capacitor from the electric components,
   wherein said switching control unit causes said capacitor to charge to the DC voltage by switching said output switch OFF and by switching said input switch ON, and
   said switching control unit causes the DC voltage of said charged capacitor to be supplied as a low-noise DC voltage to the electric components by switching said output switch ON and said input switch OFF.

3. A power supply unit of claim 2, wherein said switching control unit supplies the DC voltage from said DC power supply to said capacitor and the electric components, by switching said output switch and said input switch ON, and
   said switching control unit temporarily disconnects supply of the DC voltage from said DC power supply to said capacitor and the electric components, by switching temporarily said input switch OFF while said output switch is being ON.

4. A power supply unit of claim 1, further comprising:
   a plurality of said capacitors, provided in parallel between said DC power supply and the electric components, which charge the DC voltage; and
   a plurality of said output switches which connect or disconnect said plural capacitors from the electric components, and
   wherein said switching control unit, with one of said plural output switches being ON, makes other said output switches OFF while one of said plural output switches is being On and the DC voltage of said charged capacitor is being supplied to the electric components via said output switch having been ON.

5. A power supply unit of claim 4, further comprising a plurality of said input switches which connect or disconnect a plurality of said capacitors from said power supply,
   wherein said switching control unit, with one of said plural input switches being ON, makes other said input switches OFF while one said plural input switches is ON and the capacitor is charged to said DC voltage by said DC power supply via said input switch being ON.

6. A power supply unit of claim 2, wherein said input switch, said output switch and said capacitor are provided removably so as to be replaced anew.

7. A power supply unit of claim 1, wherein said DC power supply is an AC-DC power supply which converts AC voltage supplied from an AC power supply, to DC voltage.

8. Semiconductor device testing apparatus for testing a semiconductor device, comprising:
    a device contact portion which places the semiconductor device and inputs an input signal pattern to the semiconductor device;
    a DC power supply which supplies a DC voltage to the semiconductor placed on said device contact portion;
    a capacitor which charges or discharges the DC voltage between said power supply and the semiconductor device;
    an input switch which connects or disconnects said capacitor from the DC power supply;
    a switching control unit which makes said capacitor charged to said DC voltage by switching said input switch ON,
        said switching control unit supplying the DC voltage of said charged capacitor by switching said input switch OFF, and
        said switching control unit further including a pattern generator which supplies the input signal pattern to the semiconductor device in the event that said switching control unit switches said input switch OFF and an output switch ON,
        said output switch connecting or disconnecting said capacitor and the semiconductor device.

9. Apparatus of claim 8, further comprising an output switch which connects or disconnects said capacitor from the semiconductor device,
    wherein said switching control unit makes said capacitor charged to the DC voltage by switching said output switch OFF and switching said input switch ON, and
    wherein said switching control unit supplies the DC voltage of said charged capacitor to the semiconductor device by switching said output switch ON and switching said input switch OFF.

10. Apparatus of claim 9, wherein said pattern generator further comprises: an input signal pattern supplying unit which supplies the input signal pattern to the semiconductor device in the event said that said switching control unit switches said output switch and input switch ON, and
    wherein said switching control unit makes said input switch temporarily OFF in the event that the input signal pattern is being supplied to the semiconductor device.

11. Apparatus of claim 9, further comprises:
    a plurality of said capacitors, provided in parallel between said DC power supply and the semiconductor device, which charge to the DC voltage; and
    a plurality of said output switches which connect or disconnect a plurality of said capacitors from the semiconductor device, and
    wherein said switching control unit, with one of said plural output switches being ON, makes other said output switches OFF, while one of said plural output switches is ON and the DC voltage of said charged capacitor is supplied to the semiconductor device via said output switch being ON.

12. Apparatus of claim 11, further comprising a plurality of said input switches which connect or disconnect each of said plural capacitors from the DC power supply, respectively,
    wherein said switching control unit, with one of said plural input switches ON, makes other said input switches OFF, and at least one of said plural capacitors are charged to the DC voltage by said power supply via said input switch being ON.

13. Apparatus of claim 9, said input switch, said output switch and said capacitor are provided removably so as to be replaced anew.

14. Apparatus of claim 8, wherein said DC power supply is an AC-DC power supply which converts AC voltage supplied from an AC power supply, to DC voltage.

15. A method of testing a semiconductor device using a semiconductor device testing apparatus, the method comprising:
    charging a capacitor to a DC voltage; and
    testing the semiconductor device by:
        disconnecting the charged capacitor from the charging; and
        inputting an input signal to the semiconductor device while the DC voltage of the charged capacitor is supplied as a low-noise DC voltage to the semiconductor device.

16. A method of claim 15, wherein said charging to the DC voltage includes charging a first capacitor and a second capacitor, and said testing includes:
    disconnecting supply of the DC voltage to the first capacitor; and
    inputting the input signal pattern to the semiconductor device while the DC voltage of the first charged capacitor is being supplied to the semiconductor device, and the method further comprising:
        stopping input of the input signal pattern to the semiconductor device;
        disconnecting supply of the DC voltage of the first charged capacitor to the semiconductor;
        replacing the semiconductor device with other semiconductor device;
        connecting the second capacitor to the replaced semiconductor device in order to supply the DC voltage of the second charged capacitor to the replaced semiconductor device.

17. A method of claim 16, further comprising:
    resuming charging of the first capacitor to the DC voltage after said connecting; and
    resuming inputting the input signal pattern to the semiconductor device.

18. A method of claim 16, wherein there are provided a first input switch and a second input switch which connect or disconnect respectively supply of the DC voltage to the first capacitor and the second capacitor, and there are provided a first output switch and a second output switch which connect or disconnect respectively supply of the DC voltage of the first charged capacitor and the second charged capacitor to the semiconductor device,
    wherein said disconnecting disconnects supply of the DC voltage of the first charged capacitor to the semiconductor device by switching the first output switch OFF,
    said connecting supplies the DC voltage of the second charged capacitor to the semiconductor device by switching the second output switch ON and by switching the second input switch OFF, and
    said resuming resumes charging of the first capacitor to the DC voltage by switching the first input switch ON.

19. A method of claim 16, further comprising:

first measuring voltage of the first or second charged capacitor, prior to said testing;

second measuring voltage of the first or second capacitor after said testing;

first calculating an amount of current consumption of the semiconductor, based on difference between the voltage of the first or second capacitor measured in said first measuring and that measured in said second measuring; and second calculating an average amount of current consumption of the semiconductor, based on result obtained after repeating a plurality of times said first measuring, said second measuring and said first calculating.

20. A method of claim 16, further comprising:

measuring voltage of either the first capacitor or the second capacitor; and replacing the first capacitor and the second capacitor anew in the event that voltage of the first capacitor and second capacitor measured in said measuring is less than a predetermined reference voltage.

* * * * *